United States Patent
Crowder et al.

(10) Patent No.: US 6,395,587 B1
(45) Date of Patent: May 28, 2002

(54) FULLY AMORPHIZED SOURCE/DRAIN FOR LEAKY JUNCTIONS

(75) Inventors: Scott Crowder, Ossining; Dominic J. Schepis; Melanie J. Sherony, both of Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/502,809

(22) Filed: Feb. 11, 2000

(51) Int. Cl.⁷ .............................. H01L 21/00
(52) U.S. Cl. ...................... 438/149; 438/144
(58) Field of Search ................ 438/149, 155, 438/166, 294, 301, 303; 458/384; 257/52, 57, 66, 192, 194

(56) References Cited

U.S. PATENT DOCUMENTS

| | | | |
|---|---|---|---|
| 4,797,108 A | 1/1989 | Crowther | 437/41 |
| 4,809,056 A | 2/1989 | Shirato et al. | 357/71 |
| 4,810,664 A | 3/1989 | Kamins et al. | 437/26 |
| 5,140,390 A | 8/1992 | Li et al. | 357/23 |
| 5,264,721 A | 11/1993 | Gotou | 257/349 |
| 5,489,792 A | 2/1996 | Hu et al. | 257/347 |
| 5,742,075 A | 4/1998 | Burns et al. | 257/59 |
| 5,834,796 A | 11/1998 | Matsuda et al. | 257/57 |
| 5,840,602 A | 11/1998 | Han et al. | 438/153 |
| 5,877,046 A | 3/1999 | Yu et al. | 438/151 |
| 5,891,763 A | 4/1999 | Wanlass | 438/149 |
| 6,049,091 A * | 4/2000 | Yokoyama | 257/52 |
| 6,090,648 A * | 7/2000 | Reedy et al. | 438/155 |
| 6,184,097 B1 * | 2/2001 | Yu | 438/299 |

* cited by examiner

Primary Examiner—David Nelms
Assistant Examiner—Renee R. Berry
(74) Attorney, Agent, or Firm—Whitman, Curtis & Christofferson, P.C.; Jay H. Anderson

(57) ABSTRACT

A semiconductor device having a silicon-on-insulator (SOI) structure includes a field-effect transistor having amorphized source and drain regions formed by implanting silicon or germanium ions into a silicon layer formed over a buried insulator. The fully amorphized source and drain regions ultimately result in permanent crystalline defects that cause p-n junction leakage which allows charge in the body of the device to dissipate, thereby improving the overall efficiency and performance of the device. The source and drain regions are amorphized throughout their entire thickness to prevent single crystal re-crystallization from occurring during annealing and other subsequent processing steps that can degrade the quality of the p-n leakage junctions.

9 Claims, 5 Drawing Sheets

FULLY AMORPHIZED SOURCE/DRAIN FOR LEAKY JUNCTIONS

BACKGROUND OF THE INVENTION

1. Field of the Invention

The present invention generally relates to semiconductor devices, and more particularly to semiconductor devices having a silicon-on-insulator structure that dissipates charge within the floating body of the device.

2. Background Description

Semiconductor devices with a silicon-on-insulator (SOI) structure have an insulator layer buried under a thinner silicon layer that typically contains the source and drain regions of one or more field-effect transistors. SOI devices, more specifically, may be categorized as having one of two basic structures. The first structure includes a thin layer of silicon, usually 0.5 $\mu$m or less, on top of a thick insulator layer, which serves as the entire substrate for the device. Silicon-on-sapphire devices exemplify this type of SOI. The second structure includes an insulator layer sandwiched between a silicon substrate and an overlying silicon layer. Separation by implanted oxygen (SIMOX) devices and those made by wafer bonding exemplify this type.

SOI semiconductor devices have attributes that make them suitable for a variety of applications. For example, SOI devices are more radiation resistant and less subject to alpha-particle upsets than their bulk silicon counterparts, mainly because their ability to apply a negative bias at their back interfaces. As a result, SOI devices are often employed in space and defense electronics. SOI devices also have reduced parasitic drain capacitance realized through their use of a thick insulator. This allows the device to attain speeds faster than those formed on bulk silicon. An additional advantage is that complementary metal-oxide silicon (CMOS) devices having an SOI structure do not suffer from latch-up problems and thus are able to achieve higher packing densities than non-SOI structures. Other advantages include improved isolation properties, higher noise margins, and relatively low-standby power.

For all their advantages, conventional SOI devices have significant drawbacks which prevent them from performing optimally. For example, in conventional SOI structures, the buried oxide (insulator) layer beneath the silicon dielectrically isolates the device from the base, i.e., the underlying silicon substrate. As a result, charge often develops within the floating body of the device which does not have the capability to dissipate.

U.S. Pat. No. 5,264,721 discloses one approach for solving this problem. As shown in FIG. 1, this structure includes an insulator layer 2 of $SiO_2$ formed on a silicon substrate 1. Atop the insulator layer is a p-type silicon layer 3, followed by an isolation layer 4 and a gate electrode 5. In order to suppress a kink phenomenon in the device, aluminum ions are implanted into a source region 6' of the silicon layer to a depth which reaches a p-n junction between silicon layer 3 and the source region, which is separated from a drain region 7 by a channel 31. The implanted aluminum ions cause a leakage current to form across the source p-n junction which eliminates any potential difference that may exist between the source region 6' and the portion of the silicon layer 31' located beneath the channel 31. This prevents silicon layer 31' from floating and suppresses the kink phenomenon.

The above approach is undesirable for a number of reasons. First, it may require use of a separate masking level. Second, it implants a non-traditional species (Al) that may adversely affect operation of the resulting device.

Other approaches have been developed to dissipate the body charge in an SOI structure. These approaches involve intentionally creating junction defects in the SOI structure that result in charge leakage into the base. These conventional methods result in the formation of a source/drain with some "leakiness." However, during subsequent processing (e.g., annealing), the source/drain regions re-crystallize, which reduces the "leakiness" of the junction.

A need therefore exists for a method of forming a semiconductor device with an SOI structure that produces permanently formed junction leakage paths that consistently and efficiently dissipate charge formed in the body of such a device.

SUMMARY OF THE INVENTION

It is an objective of the present invention to provide a method for forming a semiconductor device having an SOI structure which operates with improved performance compared with conventional SOI devices.

It is another objective of the present invention to achieve the aforementioned objective by forming junction leakage paths in the source and drain regions of the SOI structure that will consistently and efficiently dissipate body charge during operation of the device.

It is another objective of the present invention to form the aforementioned permanent junction leakage paths by implanting the source and drain regions of the SOI device with amorphizing species, thereby enabling the source and drain junctions to retain their leakage characteristics in spite of any subsequent processing steps that may be required to produce the finalized SOI product.

It is another objective of the present invention to provide a method of the aforementioned type that reduces body charge, may not require use of separate masks, uses traditional species (e.g., Ge, Si) to produce a uniform pre-amorphized layer, and causes leakage by creating extended crystalline defects.

It is another objective of the present invention to provide a semiconductor device having an SOI structure with increased resistance to floating-body effects.

These and other objectives of the present invention are achieved by providing a method in which source and drain regions of an SOI structure are implanted with an amorphizing species (e.g., germanium or silicon) to a predetermined depth. The implant depth and concentration is selected so that the source and drain are fully amorphizing (i.e., the amorphous species is implanted throughout the entire thickness of the source and drain) to ensure that p-n leakage junctions are formed that dissipate body charge throughout the life of the device. As a result, the SOI structure of the claimed invention is fabricated with greater simplicity while using otherwise traditional fabrication techniques.

Another advantage is that the junction leakage produced by the claimed invention reduces the so-called "kink effect." In a floating body SOI device, charge tends to build up in the body. This causes the threshold voltage to decrease and consequently the drain current to increase. This increase in current is observed as a "kink" in the transistor output characteristics. By producing leakage in the body, the present invention suppresses this kink effect, thereby improving operational performance.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
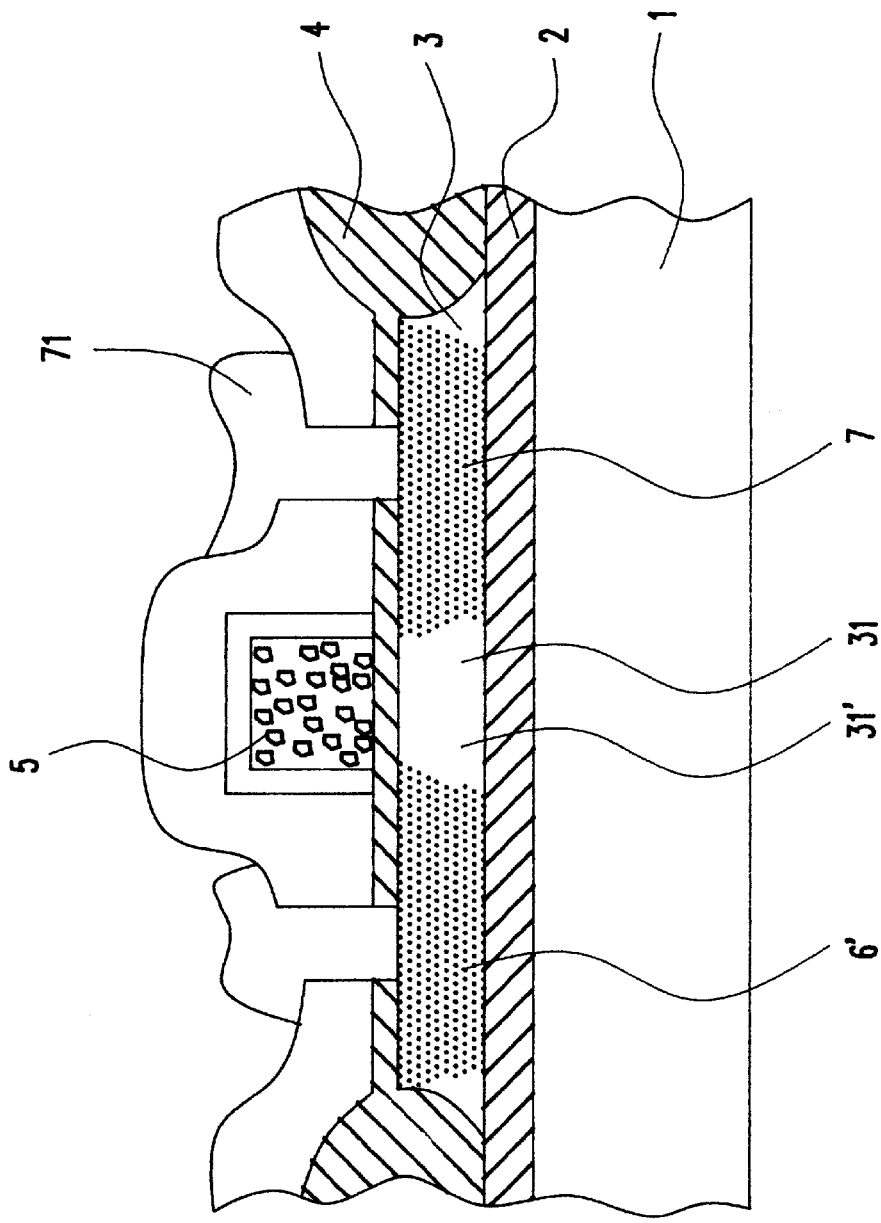
FIG. 1 is a diagram of a semiconductor device having a conventional SOI structure.
Figure 2:
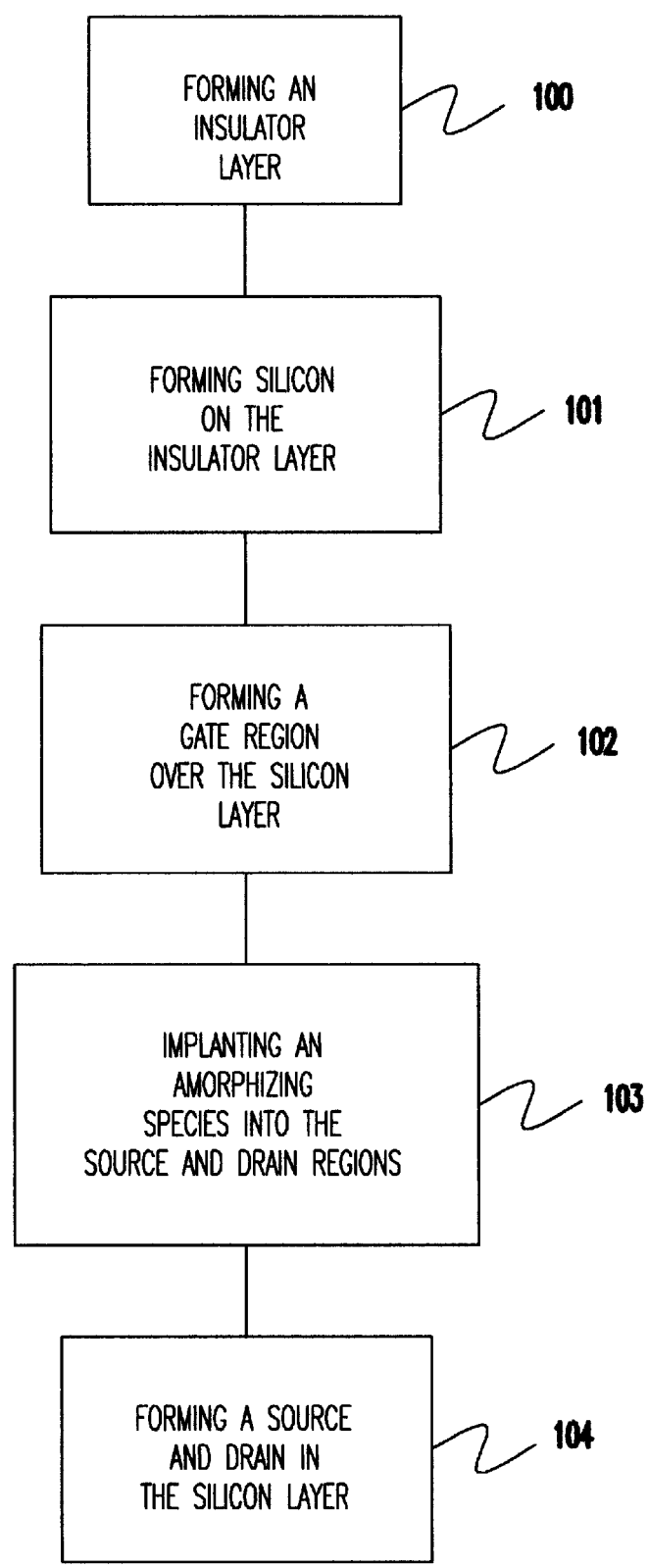
FIG. 2 is a flow diagram setting forth steps included in the method of the present invention.

Referring to FIG. 2, the method of the present invention begins by forming SOI semiconductor device which includes a field effect transistor disposed on an insulator layer in accordance with any one of a variety of conventional processing techniques. These techniques may include forming an insulator layer made, for example, of $SiO_2$, and then forming a silicon layer over the insulator layer. (Blocks 100 and 101). The insulator layer may be formed on a silicon substrate or may have a thickness sufficient to effectively serve as the substrate itself. Additional masking and deposition steps are then performed to create the gate region at a position over top the channel in the silicon (Block 103).

Once these elements are formed, the method continues by implanting an amorphizing species into the source region and the drain region of the silicon layer. (Block 103). The concentration and depth of implantation are sufficient to ensure that the source and drain regions are fully amorphized to the bottom of the silicon layer. Finally, the silicon layer is masked and doped to form a source region and drain region of the transistor with a channel residing therebetween. (Block 104).

Preferably, in Block 103, the amorphizing species is implanted throughout the entire thickness of the source and drain regions, that is, from a top surface of the silicon layer to the boundary between the silicon layer and the underlying insulator layer. Because the source and drain are amorphized in this manner, any crystal base that might form a seed layer for re-crystallization during subsequent processing steps is removed. Moreover, to the extent that any re-crystallization does occur, that re-crystallization will be limited to irregular regions of crystallization that will still leave an SOI structure having leaky junctions for body charge dissipation. (As an optional step, the present invention minimize thermal cycles to avoid any regrowth that may occur from the body.) The present invention, thus, provides a structure for efficiently dissipating body charge that is superior to any conventional approach known heretofore.

As for the implant conditions, the depth of implantation may be controlled by adjusting the ion implant energy to correspond to the silicon thickness. Further, it is preferable to implant the same amorphizing species in both the source and drain regions, since by doing so the present invention advantageously ensures that no additional or extraneous masking levels are required. Further, it is preferable to implant the source and drain regions at the same time after gate formation, thereby making the method of the present invention a self-aligned process.

In order to reach amorphization, the concentration of the implant must correspond to critical dose. A dose to achieve Ge amorphization may, for example, be approximately $5.0 \times 10^{14}/cm^2$. Doses from $1 \times 10^{14}/cm^2$ to about $1 \times 10^{15}/cm^2$ would also be acceptable for causing the amorphous regions in accordance with the present invention. Using a concentration in this range advantageously produces amorphous layers that will not regrow into single crystal silicon if the seed layer were removed. Energies of about 30 to 40 Kev for very thin films (e.g., a few hundred angstroms) to several hundred Kev for thicker films may also be used. As one skilled in the art can appreciate, however, the exact implant conditions depend on the Si film thickness being amorphized and the species being used.

If the film is thick enough, two or more implants at different energies may be used to achieve the amorphization. For example, implantation may be performed at 50 Kev, 100 Kev, and 200 Kev, respectively, at a constant dose in the aforementioned range in order to ensure that the damage layer is formed every where down to the buried oxide.

As previously emphasized, by implanting an amorphizing species throughout the entire thickness of the source and drain regions, the SOI structure of the present invention is ensured of having permanently formed crystalline defects. This advantageously produces permanent leaky p-n junctions between the source/drain regions and the channel region, i.e., junctions which are not eliminated by any re-crystallization that might occur in the source and drain regions during subsequent processing steps such as annealing. This represents a significant improvement over conventional methods.

Conventional methods produce SOI structures with leaky source/drain junctions, but only temporarily or at best ineffectively. According to these conventional methods, defects are created at the p-n junctions between the source and channel and between the drain and channel. As a result, leaky junctions are created. During subsequent processing steps (e.g., annealing), however, the source and drain regions re-crystallize from a single crystal base acting as seed. As a result, the "leakiness" of the junctions are substantially reduced if not altogether eliminated, thereby allowing for charge build up to occur in the body of the device.

The present invention does not realize these drawbacks. The leaky junctions of the present invention are produced as a result of an amorphizing species implanted into the full thickness of the source and drain regions. By making the source and drain regions amorphized in this manner, leakage through the source and drain junctions is quite high and remains so even after subsequent processing steps such as annealing are performed.

Preferably, the present invention makes the amorphization (i.e, makes the extent of its damage layer) constant from the top of the silicon to the bottom. In contrast, conventional methods place a defect-causing layer at some depth between the top and bottom of the silicon layer. Above and below this depth, the damage is different and so the leakage is different. The present invention, however, is more constant as a function of depth. Also, by amorphizing the entire layer, the present invention simplifies the manufacturing process because it does not need to place a damage layer at a precise depth. As a result, the invention has a larger process window than conventional methods with improved control during manufacturing.

Figure 3:
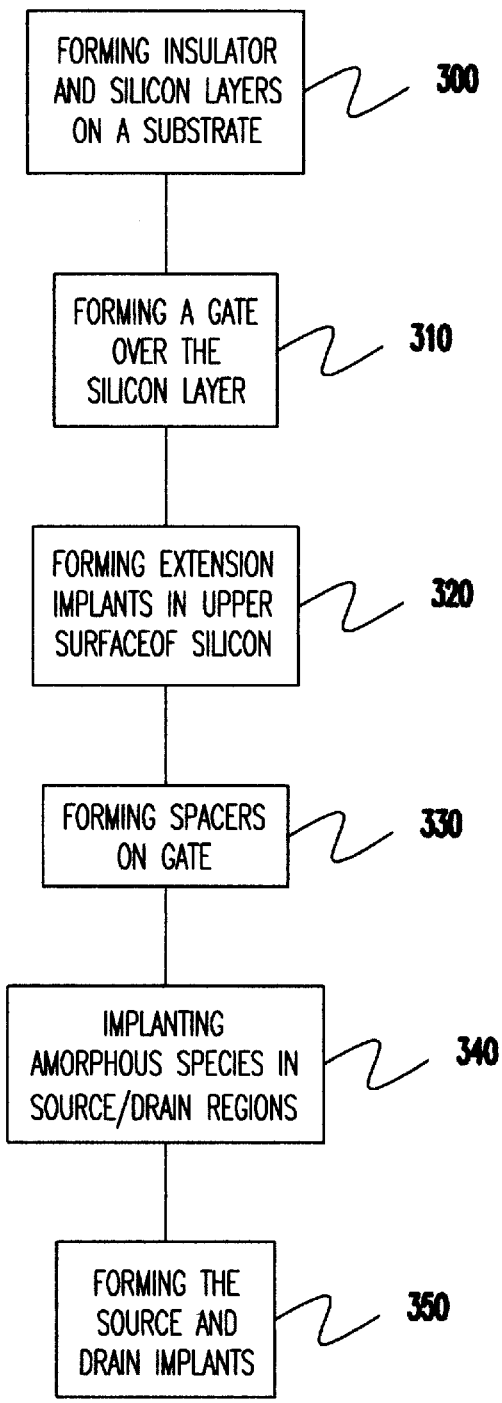
FIG. 3 is a flow diagram setting forth steps included in a preferred embodiment of the method of the present invention.
Figure 4:
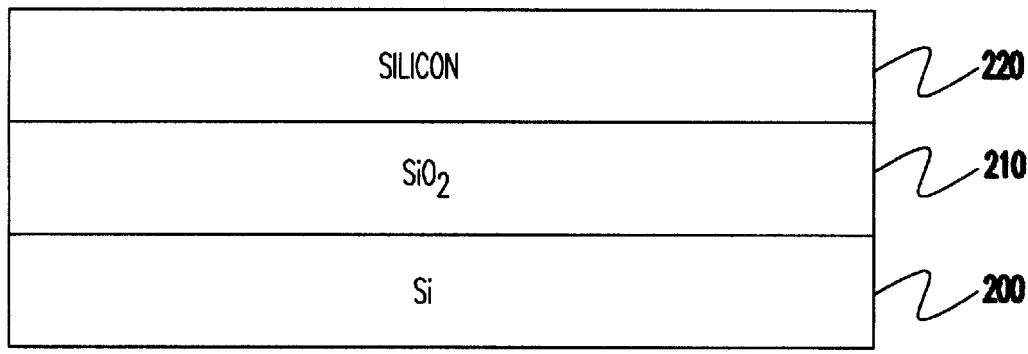
FIGS. 4 is a diagram showing an initial step of forming an SOI structure in accordance with the preferred embodiment of the method of the present invention.
Figure 5:
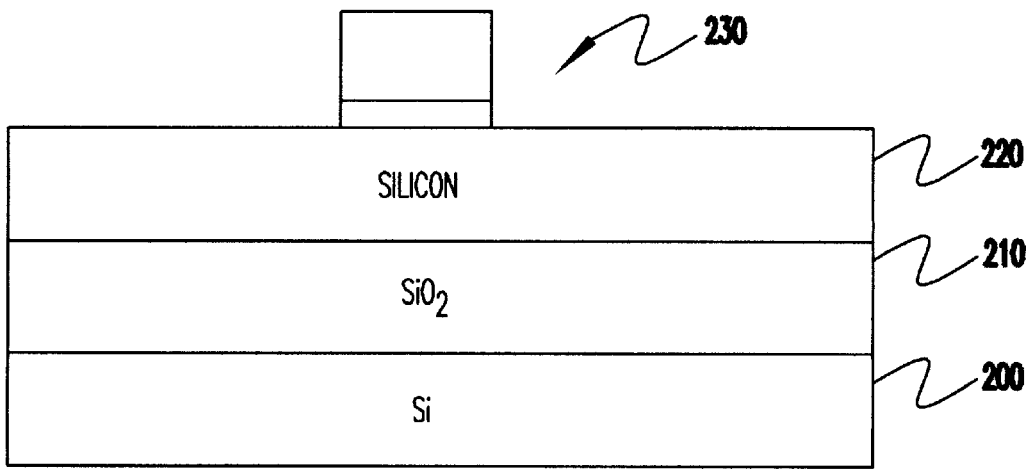
FIG. 5 is a diagram showing formation of a gate in accordance with the preferred embodiment of the method of the present invention.
Figure 6:
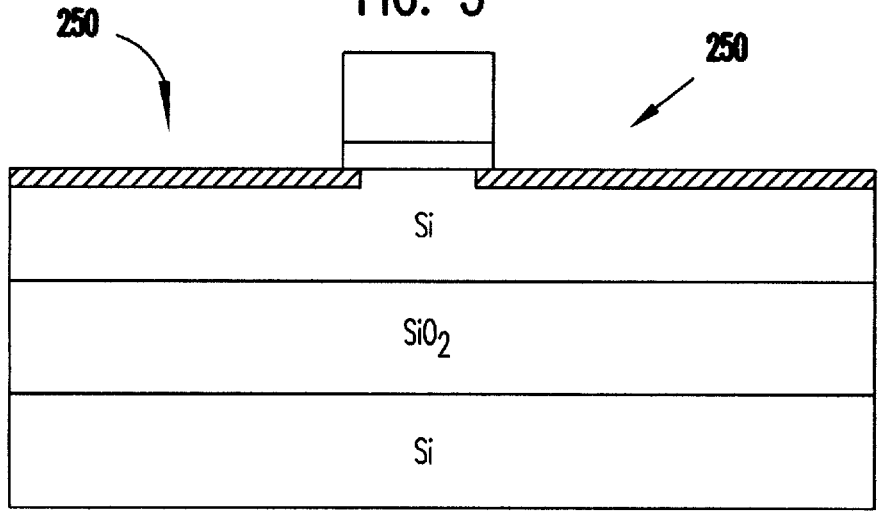
FIG. 6 is a diagram showing the formation of extension implants in an upper surface of a silicon layer in accordance with the present invention.
Figure 7:
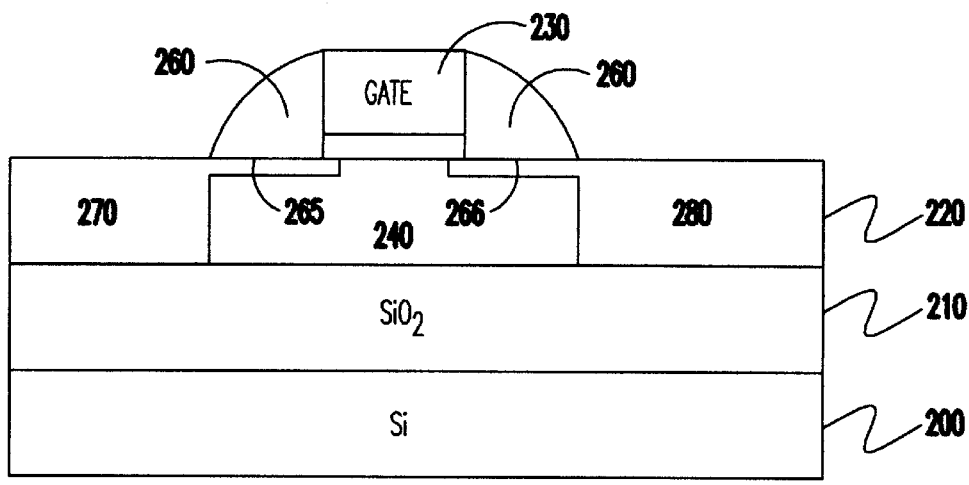
FIG. 7 is a diagram showing the formation of spacers on either side of a gate in accordance with the present invention.

A preferred embodiment of the method of the present invention includes the steps set forth in the flow diagram of FIG. 3, described with reference to FIG. 4–9. The method begins by forming an SOI structure including a layer 210 of dielectric material (e.g., $SiO_2$) on a silicon substrate 200, followed by a layer 220 of silicon. (Block 300 and FIG. 4). A gate 230 is then formed over the silicon layer 220 at a position that will overlie a channel region 240. (Block 310 ane FIG. 5). Next, extension implants 250 are formed in an upper surface of the silicon layer on either side of the gate. (Block 320 and FIG. 6). The formation of the gate advantageously allows the process for forming the extension implants to be self-aligning. Spacers 260 are then formed on the sides of the gate and project over shallow doped extensions 265 and 266. (Block 330 and FIG. 7).

Once this basic SOI structure has been formed, the method continues by implanting an amorphizing species throughout the entire thickness of the silicon layer that will correspond to a source region 270 and a drain region 280 of the device, i.e., from a top surface 300 of the silicon layer all the way through to the underlying insulator layer 210. (Block 340 and FIG. 8). Finally, the source and drains implants are formed. (Block 350). It should be noted that the concentration and depth of implantation are sufficient to ensure that the source and drain regions are fully amorphized from the top surface to the bottom surface of the silicon film. (FIG. 9).

The amorphous species may be any material conventionally known such as germanium or silicon, or may include a combination of these materials, e.g., silicon and germanium to potentially realize a better or more uniform amorphization. Additionally, other ions, particularly heavy ions, may be used such as, for example, tin Sn, As, and In, however Ge and Si are preferable because they do not act as dopants.

Next, dopants are diffused into layer 220 to form source and drain regions 230 and 240, respectively, with a channel region 250 therebetween. Preferably, the source and drain regions are formed to have doped shallow extensions 260 and 270. (Block 310 and FIG. 5). All of the aforementioned steps may be performed in accordance with conventional techniques disclosed, for example, in U.S. Pat. Nos. 5,652, 454, 5,767,549, and 6,010,921, the contents of which is herein incorporated by reference.

Figure 8:
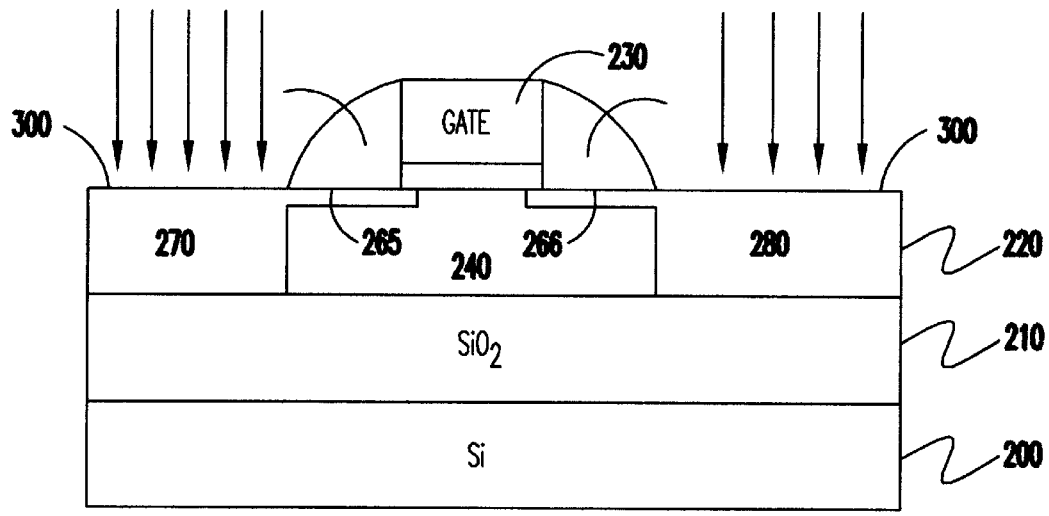
FIG. 8 is a diagram showing the implantation of an amorphizing species throughout the entire depths of source and drain regions in accordance with the present invention.
Figure 9:
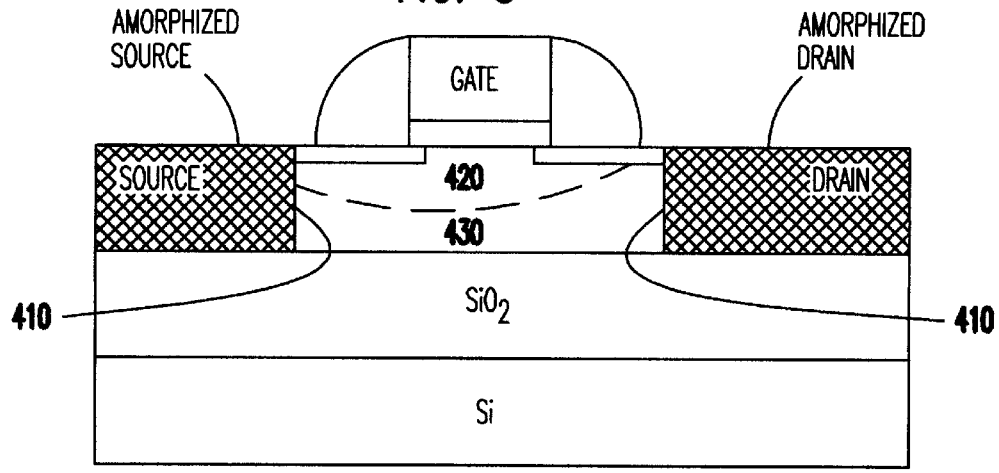
FIG. 9 is a diagram showing the semiconductor device having an SOI structure in accordance with the present invention.

As further shown in FIG. 8, the spacers protect the doped shallow extensions during the implanting steps. Further, a hard mask may be used to protect the gate region.

The SOI structure of the present invention realizes improved performance over its conventional counterparts. In operation, the amorphized source and drain regions 230 and 240 cause leaky p-n junctions 410 to be permanently formed between the source and channel and the drain and channel regions. These p-n junctions create a leakage current path which dissipate charge that builds up in the portion of the device known as the body, which corresponds to a neutral region 420 located under a diffusion region 430 in the channel region. Dissipation of this charge reduces or eliminates floating-body effects which impair the performance of conventional SOI structures. As a result, the SOI structure of the present invention operates with substantially improved efficiency.

In summary, the method of the present invention is different from conventional methods. During semiconductor processing, for example, conventional SOI processes pre-amorphize to improve the results from subsequent implants with the intention of always being able to re-grow the single crystal silicon from the underlying seed layer. The present invention, however, deals with a way of controlling floating body effects in SOI structures by creating leakage. Moreover, conventional methods introduce additional species or dopants to cause this leakage. The present invention applies pre-amorphization but uses it in an unusual way by amorphizing the entire silicon film, leaving no single crystal seed layer underneath by which the layer can recrystallize into single crystal silicon. Anneals used in normal processing will cause the amorphous layer to crystallize, however unlike conventional methods, a single crystal layer will not be produced and the extended crystalline defects which result provide the desired leakage.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

We claim:

1. A method for making a semiconductor device having an SOI structure, comprising:

forming an insulator layer;

forming a silicon layer over said insulator layer, said silicon layer including a channel region disposed between a source region and a drain region;

forming a gate region over said silicon layer, said gate region, source region, and drain region forming a field effect transistor;

forming a first permanent leaky p-n junction between said source region and said channel region by implanting an amorphizing species throughout an entire thickness of a first region of said silicon layer, said first region corresponding to a source of said transistor; and forming a second permanent leaky p-n junction between said drain region and said channel region by implanting an amorphizing species throughout an entire thickness of a second region of said silicon layer, said second region corresponding to a drain of said transistor.

2. The method of claim 1, wherein the entire thickness of said first region extends from a top surface of said source to said insulator layer, and wherein the entire thickness of said second region extends from a top surface of said drain to said insulator layer.

3. The method of claim 2, wherein said amorphizing species is one of germanium, silicon, tin, In, and As.

4. The method of claim 1, wherein said step of forming a silicon layer includes forming said source with a doped shallow extension that underneath of said gate region and forming said drain with a doped shallow extension underneath of said gate region, said method further comprising:

forming spacers on sides of said gate region, said spacers preventing said amorphizing species from becoming implanted in said doped shallow extension of said source and said doped shallow extension of said drain during said implanting steps.

5. The method of claim 1, further comprising:

forming a mask over said gate region during said implanting steps, said mask preventing said amorphizing species from becoming implanted in said gate region.

6. The method of claim 4, wherein said doped shallow extensions of said source and drain are not amorphized.

7. A method for making a semiconductor device having an SOI structure, comprising:

depositing a gate region over said silicon layer which includes a source region and a drain region;

implanting an amorphizing species throughout an entire thickness of said source region; and implanting an amorphizing species throughout an entire thickness of said drain region.

8. The method of claim 7, wherein a channel region is disposed between said source region and said drain region, said amorphized source region forming a permanent leaky p-n junction between the channel region and the source region, and said amorphized drain region forming a permanent leaky p-n junction between the channel region and the drain region.

9. The method of claim 7, further comprising:

forming extension regions from the source region and the drain region, said extensions containing none of said amorphized species.

* * * * *